US012795891B2

(12) United States Patent
Park et al.

(10) Patent No.: US 12,795,891 B2
(45) Date of Patent: Nov. 10, 2026

(54) SEMICONDUCTOR DEVICE INCLUDING CAPACITOR

(71) Applicant: Samsung Electronics Co., Ltd., Suwon-si (KR)

(72) Inventors: Jungmin Park, Suwon-si (KR); Hanjin Lim, Suwon-si (KR); Hyungsuk Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 758 days.

(21) Appl. No.: 18/151,805

(22) Filed: Jan. 9, 2023

(65) Prior Publication Data

US 2023/0413522 A1 Dec. 21, 2023

(30) Foreign Application Priority Data

Jun. 10, 2022 (KR) ........................ 10-2022-0070569

(51) Int. Cl.
*H10B 12/00* (2023.01)
*H10B 53/00* (2023.01)
(Continued)

(52) U.S. Cl.
CPC ........... *H10B 12/315* (2023.02); *H10B 12/03* (2023.02); *H10B 12/033* (2023.02); *H10B 53/00* (2023.02); *H10B 53/30* (2023.02); *H10B 12/34* (2023.02); *H10D 1/684* (2025.01); *H10D 1/696* (2025.01); *H10D 1/716* (2025.01)

(58) Field of Classification Search
CPC .... H10B 12/03; H10B 12/033; H10B 12/315; H10B 53/00; H10B 53/30
See application file for complete search history.

(56) References Cited

U.S. PATENT DOCUMENTS 10,910,383 B2 2/2021 Kim et al.
11,171,145 B2 11/2021 Chang et al.
(Continued)

FOREIGN PATENT DOCUMENTS

CN 112838163 A 5/2021
KR 10-0718267 B1 9/2006
(Continued)

OTHER PUBLICATIONS

Extended European Search Report dated Oct. 30, 2023 issued in European Patent Application No. 23160916.5-1212.
(Continued)

*Primary Examiner* — Molly K Reida
(74) *Attorney, Agent, or Firm* — Fish & Richardson P.C.

(57) ABSTRACT

A semiconductor device including a substrate, a plurality of lower electrodes on the substrate, a dielectric layer stack covering the lower electrodes, and an upper electrode covering the dielectric layer stack may be provided. The dielectric layer stack may include a first dielectric layer on the plurality of lower electrodes, the first dielectric layer including a material having anti-ferroelectricity or paraelectricity, and a second dielectric layer between the first dielectric layer and the upper electrode, the second dielectric layer including a material having ferroelectricity. The upper electrode may include a first upper electrode layer including an N-type impurity.

20 Claims, 13 Drawing Sheets

(51) Int. Cl.
*H10B 53/30* (2023.01)
*H10D 1/68* (2025.01)

(56) References Cited

U.S. PATENT DOCUMENTS

| | | | |
|---|---|---|---|
| 2006/0214204 A1 | 9/2006 | Yoo et al. | |
| 2014/0077336 A1 | 3/2014 | Chiang et al. | |
| 2019/0074295 A1 | 3/2019 | Schroder | |
| 2020/0194443 A1 | 6/2020 | Lin et al. | |
| 2020/0212168 A1 | 7/2020 | Yoo et al. | |
| 2021/0125993 A1 | 4/2021 | An et al. | |
| 2021/0142946 A1 | 5/2021 | Kang et al. | |
| 2021/0359082 A1 | 11/2021 | Kang | |
| 2021/0359100 A1* | 11/2021 | Maeng | H10D 1/684 |
| 2022/0130835 A1 | 4/2022 | An et al. | |

FOREIGN PATENT DOCUMENTS

| | | | |
|---|---|---|---|
| KR | 10-2020-0084469 A | 7/2020 |
| KR | 10-2021-0142345 A | 11/2021 |
| TW | 202213348 A | 4/2022 |
| WO | WO-2022/042253 A1 | 3/2022 |

OTHER PUBLICATIONS

Office Action in Korean Appln. No. 10-2022-0070569, mailed on Mar. 12, 2026, 11 pages (with English translation).
Office Action in Taiwanese Appln. No. 112109134, mailed on Sep. 20, 2026, 22 pages (with English translation).

* cited by examiner

SEMICONDUCTOR DEVICE INCLUDING CAPACITOR

CROSS-REFERENCE TO RELATED APPLICATION(S)

This application claims benefit of priority to Korean Patent Application No. 10-2022-0070569 filed on Jun. 10, 2022 in the Korean Intellectual Property Office, the disclosure of which is incorporated herein by reference in its entirety.

BACKGROUND

One or more example embodiments relate to semiconductor devices.

In accordance with the demand for a high degree of integration and miniaturization of a semiconductor device, the capacitor of the semiconductor device also has a reduced size. Accordingly, various studies have been undertaken to optimize the structure of a capacitor capable of storing information in a dynamic random-access memory (DRAM).

SUMMARY

An aspect provides a semiconductor device having improved electrical properties and reliability.

According to an example embodiment, a semiconductor device may include a substrate, a plurality of lower electrodes on the substrate, a dielectric layer stack covering the lower electrodes, and an upper electrode covering the dielectric layer stack. The dielectric layer stack may include a first dielectric layer being on the plurality of lower electrodes, the first dielectric layer including a material having anti-ferroelectricity or paraelectricity, and a second dielectric layer between the first dielectric layer and the upper electrode, the second dielectric layer including a material having ferroelectricity. The upper electrode may include a first upper electrode layer including an N-type impurity.

According to an example embodiment, a semiconductor device may include a substrate, a plurality of lower electrodes on the substrate, a dielectric layer stack covering the plurality of lower electrodes, the dielectric layer stack including a plurality of dielectric layers, and an upper electrode covering the dielectric layer stack, the upper electrode including a first metal having a first valence. The dielectric layer stack may include a ferroelectric layer more adjacent to the upper electrode than to the lower electrodes, the ferroelectric layer having a thickness of about 5 Å to about 20 Å. The upper electrode may include a first upper electrode layer including the first metal and a second metal having a second valence greater than the first valence.

According to an example embodiment, a semiconductor device may include an isolation layer defining active regions on a substrate, gate electrodes crossing the active regions and extending into the isolation layer, first impurity regions and second impurity regions in the active regions and a pair of one of the first impurity regions and one of the second impurity regions adjacent to the one of the first impurity regions being on opposite sides of a corresponding one of the gate electrodes, bit lines over the gate electrodes and connected to the first impurity regions, conductive patterns on side surfaces of the bit lines and connected to the second impurity regions, a plurality of lower electrodes vertically extending on the conductive patterns and connected to the conductive patterns, respectively, at least one supporter layer spaced apart from an upper surface of the substrate in a vertical direction, extending in a direction parallel to the upper surface of the substrate, and being in contact with a side surface of the plurality of lower electrodes adjacent thereto, a first dielectric layer covering the lower electrodes and the supporter layer, the first dielectric layer including a material having anti-ferroelectricity or paraelectricity, a second dielectric layer covering the first dielectric layer, the second dielectric layer including a material having ferroelectricity, and an upper electrode covering the second dielectric layer, the upper electrode including a first upper electrode layer including an N-type impurity.

A semiconductor device according to example embodiments may include a capacitor including a ferroelectric layer and a doped layer including an N-type impurity, thereby reducing a leakage current.

The various and beneficial advantages and effects of example embodiments are not limited to the above description, and will be more easily understood in the course of describing specific example embodiments.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, some example embodiments will be described with reference to the accompanying drawings.

As used herein, expressions such as "at least one of," when preceding a list of elements, modify the entire list of elements and do not modify the individual elements of the list. Thus, for example, both "at least one of A, B, or C" and "A, B, and C" mean either A, B, C or any combination thereof.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1A:
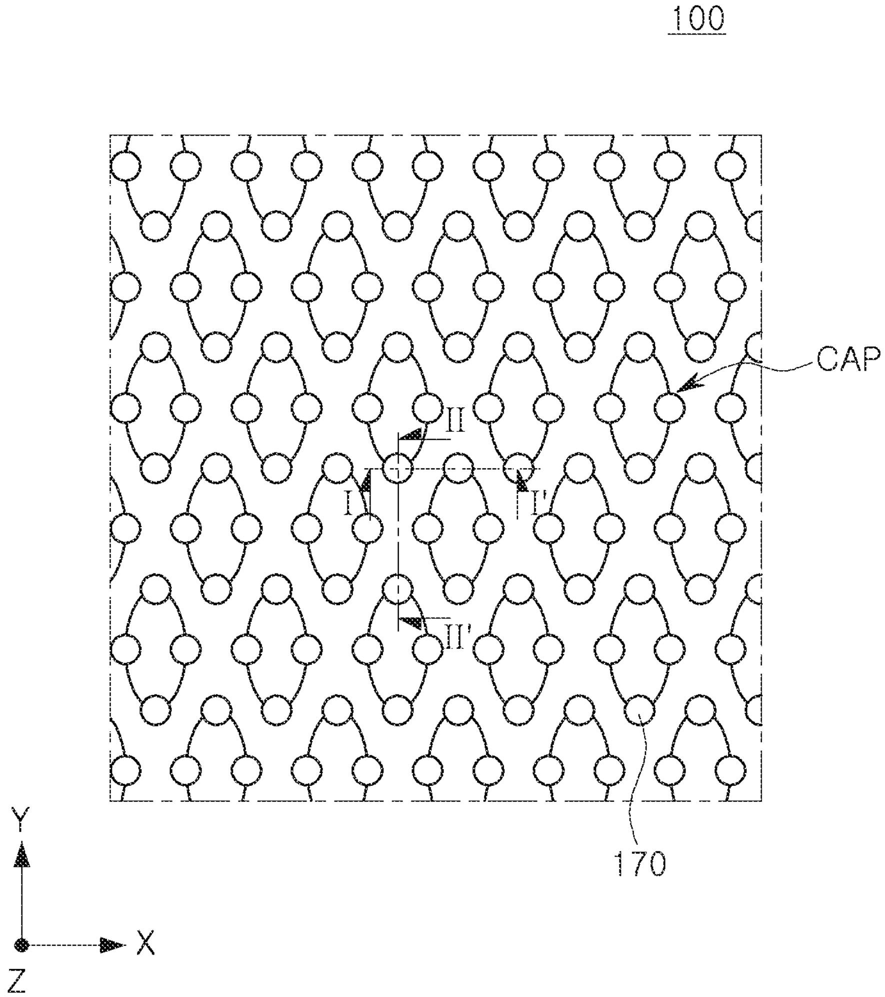
FIGS. 1A and 1B are schematic layouts illustrating a semiconductor device according to an example embodiment.
Figure 1B:
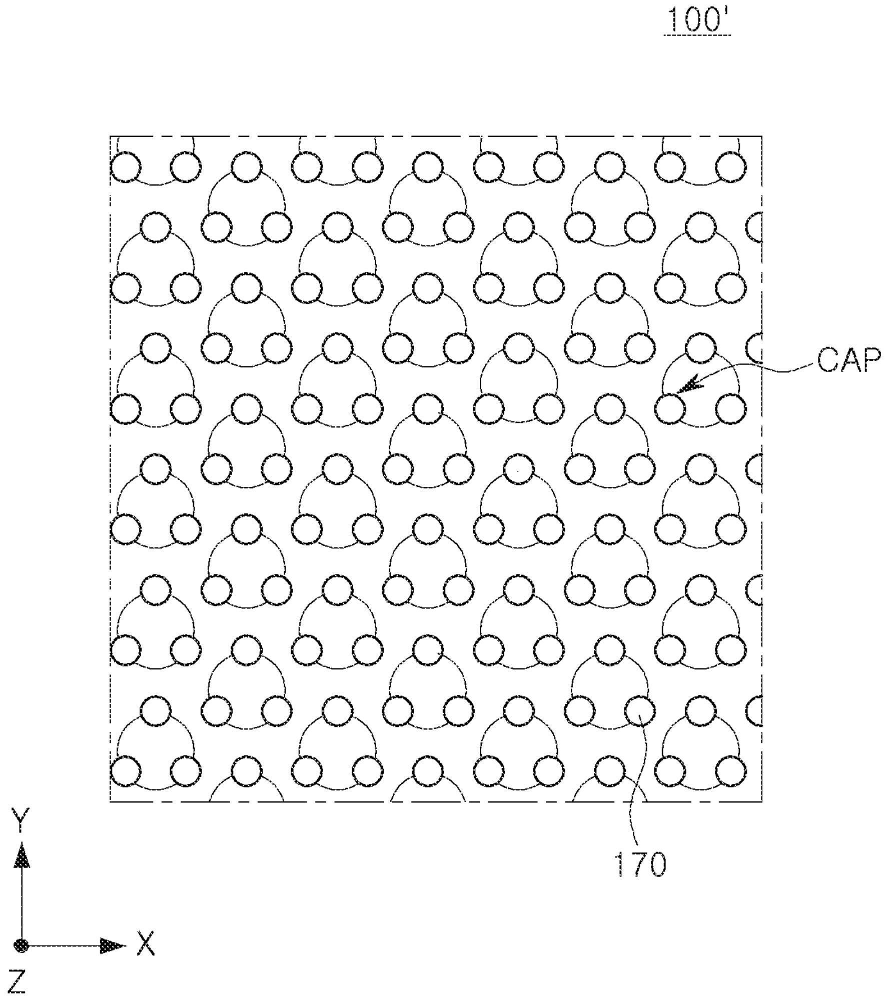

FIGS. 1A and 1B are plan views illustrating a semiconductor device according to an example embodiment.

Figure 2:
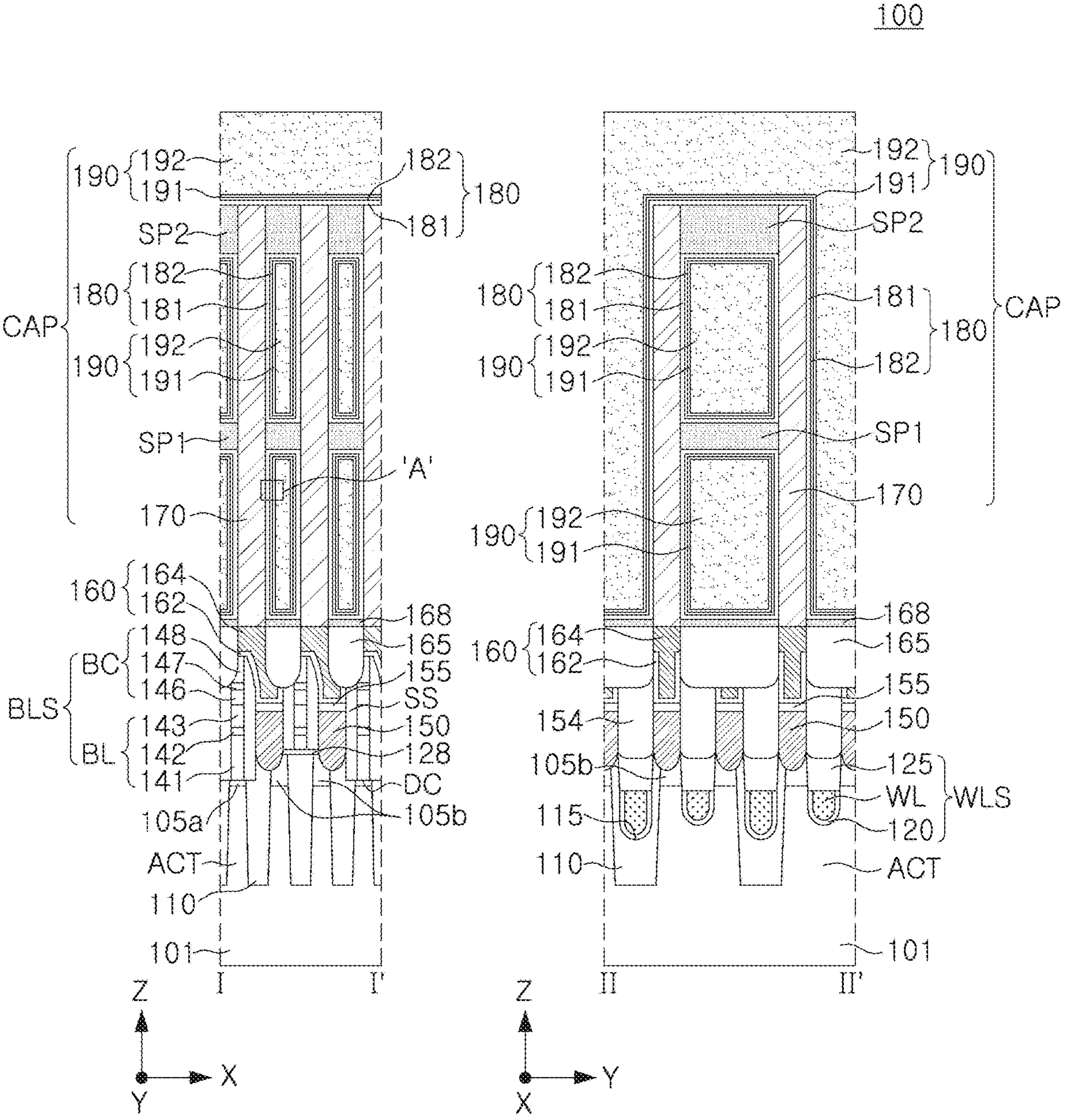
FIG. 2 is a cross-sectional view illustrating a semiconductor device according to an example embodiment.

FIG. 2 is a cross-sectional view illustrating a semiconductor device according to an example embodiment. FIG. 2 illustrates cross-sections of the semiconductor device of FIG. 1A taken along cutting lines I-I' and II-II'.

Figure 3:
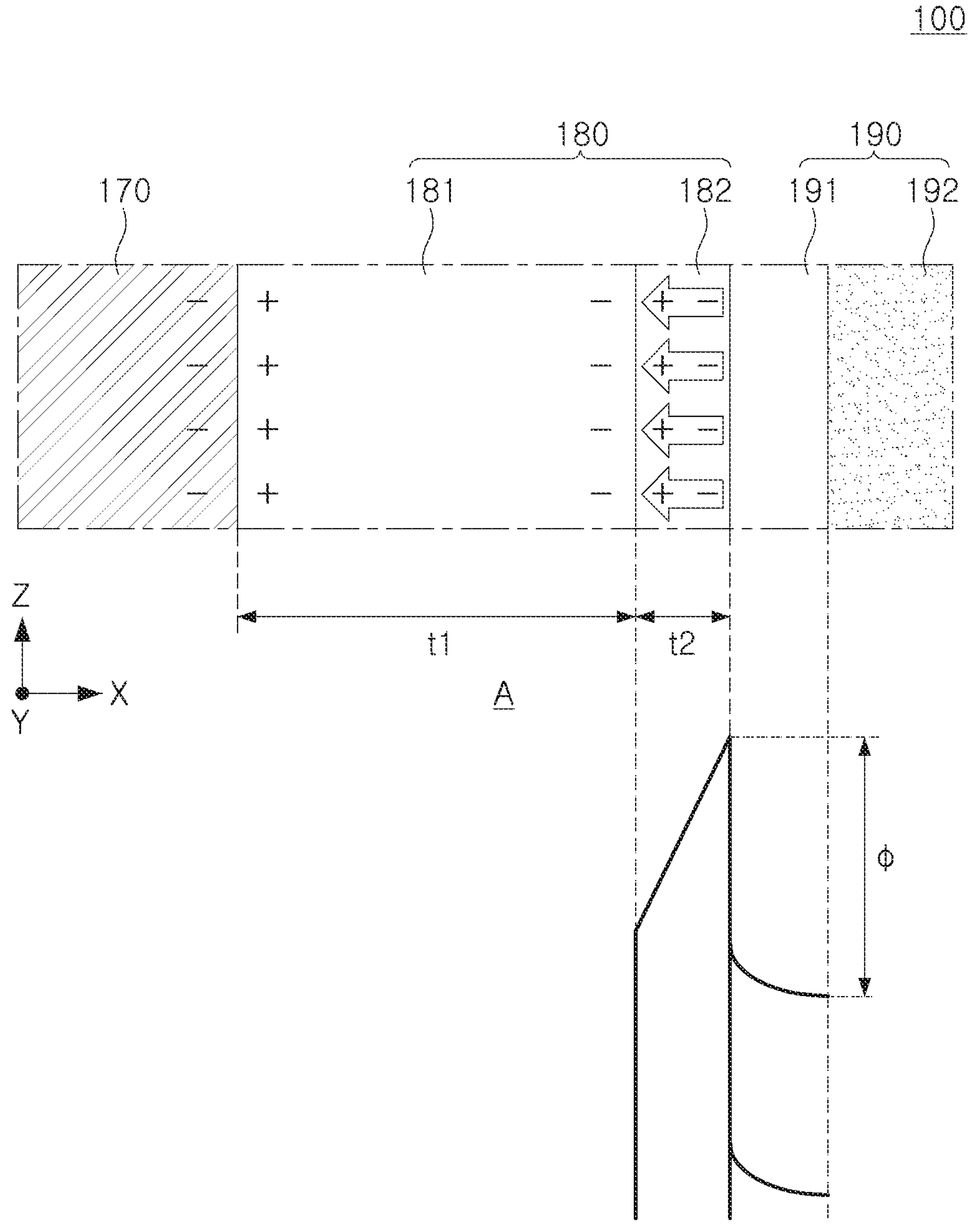
FIG. 3 is a partially enlarged view illustrating a portion of a semiconductor device according to an example embodiment.

FIG. 3 is a partially enlarged view illustrating a portion of a semiconductor device according to an example embodiment. FIG. 3 is an enlarged view of region "A" of FIG. 2.

For ease of description, only main components of a semiconductor device are illustrated in FIGS. 1A, 1B, 2 and 3.

Referring to FIGS. 1A, 2 and 3, a semiconductor device 100 may include a substrate 101 including active regions ACT, an isolation layer 110 defining the active regions ACT in the substrate 101, a word line structure WLS buried in the substrate 101 to extend, the word line structure WLS including a word line WL, a bit line structure BLS extending to intersect the word line structure WLS on the substrate 101, the bit line structure BLS including a bit line BL, and a capacitor structure CAP on the bit line structure BLS. The semiconductor device 100 may further include a lower conductive pattern 150 on the active region ACT, an upper conductive pattern 160 on the lower conductive pattern 150, and an insulating pattern 165 passing through the upper conductive pattern 160.

The semiconductor device 100 may include, for example, a cell array of a dynamic random access memory (DRAM). For example, the bit line BL may be connected to a first impurity region 105*a* of the active region ACT, and a second impurity region 105*b* of the active region ACT may be electrically connected to the capacitor structure CAP on the upper conductive pattern 160 through the lower and upper conductive patterns 150 and 160. The capacitor structure CAP may include lower electrodes 170, a dielectric layer stack 180 on the lower electrodes 170, and an upper electrode 190 on the dielectric layer stack 180. The dielectric layer stack 180 may include a first dielectric layer 181 and a second dielectric layer 182. The upper electrode 190 may include a first upper electrode layer 191 and a second upper electrode layer 192. The capacitor structure CAP may further include an etch-stop layer 168 and supporter layers SP1 and SP2.

The semiconductor device 100 may include a cell array region in which a cell array is disposed and a peripheral circuit region in which peripheral circuits for driving memory cells disposed in the cell array are disposed. The peripheral circuit region may be disposed around the cell array region.

The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may further include impurities. The substrate 101 may be a silicon substrate, a silicon on insulator (SOI) substrate, a germanium substrate, a germanium on insulator (GOI) substrate, a silicon-germanium substrate, or a substrate including an epitaxial layer.

The active regions ACT may be defined in the substrate 101 by the isolation layer 110. The active region ACT may have a bar shape, and may be disposed to have an island shape extending in one direction in the substrate 101. The one direction may be a direction inclined with respect to extension directions of the word lines WL and the bit lines BL. The active regions ACT may be arranged parallel to each other, and an end of one active region ACT may be arranged adjacent to a central portion of another active region ACT adjacent thereto.

The active region ACT may have first and second impurity regions 105*a* and 105*b* having a desired (or alternatively, predetermined) depth from an upper surface of the substrate 101. The first and second impurity regions 105*a* and 105*b* may be spaced apart from each other. The first and second impurity regions 105*a* and 105*b* may serve as a source/drain region of a transistor formed by the word line WL. The source region and the drain region, which are formed by the first and second impurity regions 105*a* and 105*b* caused by doping or ion implantation of substantially the same impurities, may be interchangeably referred to depending on a circuit configuration of a finally formed transistor. The impurities may include impurities having a conductivity type opposite to that of the substrate 101. In some example embodiments, depths of the first and second impurity regions 105*a* and 105*b* in the source region and the drain region may be different from each other.

The isolation layer 110 may be formed by a shallow trench isolation (STI) process. The isolation layer 110 may electrically isolate the active regions ACT from each other while surrounding the active regions ACT. The isolation layer 110 may be formed of an insulating material, for example, silicon oxide, silicon nitride, or a combination thereof. The isolation layer 110 may include a plurality of regions having different lower end depths according to a width of a trench in which the substrate 101 is etched.

The word line structures WLS may be disposed in gate trenches 115 extending in the substrate 101. Each of the word line structures WLS may include a gate dielectric layer 120, the word line WL, and a gate capping layer 125. In this specification, a "gate 120 and WL" may be referred to as a structure including the gate dielectric layer 120 and the word line WL, and the word line WL may be referred to as a "gate electrode," and the word line structure WLS may be referred to as a "gate structure."

The word line WL may extend in a first direction X across the active region ACT. For example, a pair of word lines WL adjacent to each other may be disposed to cross one active region ACT. The word line WL may form a gate of a buried channel array transistor (BCAT), but the present disclosure is not limited thereto. In some example embodiments, the word lines WL may be disposed on an upper portion of the substrate 101. The word line WL may be disposed on a lower portion of a gate trench 115 to have a desired (or alternatively, predetermined) thickness. An upper surface of the word line WL may be positioned on a level lower than that of the upper surface of the substrate 101. In this specification, the high and the low of the term "level" may be defined based on a substantially flat upper surface of the substrate 101.

The word line WL may include a conductive material, for example, at least one of polycrystalline silicon (Si), titanium (Ti), titanium nitride (TiN), tantalum (Ta), tantalum nitride (TaN), tungsten (W), tungsten nitride (WN), and aluminum (Al). For example, the word line WL may include a lower pattern and an upper pattern formed of different materials. The lower pattern may include at least one of tungsten (W), titanium (Ti), tantalum (Ta), tungsten nitride (WN), titanium nitride (TiN), and tantalum nitride (TaN). The upper pattern may be a semiconductor pattern including polysilicon doped with a P-type or N-type impurity.

The gate dielectric layer 120 may be disposed on a bottom surface and inner side surfaces of the gate trench 115. The gate dielectric layer 120 may conformally cover an inner wall of the gate trench 115. The gate dielectric layer 120 may include at least one of silicon oxide, silicon nitride, and silicon oxynitride. The gate dielectric layer 120 may be, for example, a silicon oxide film or an insulating film having a high dielectric constant. In some example embodiments, the gate dielectric layer 120 may be a layer formed by oxidizing the active region ACT or a layer formed by deposition.

The gate capping layer 125 may fill the gate trench 115 on an upper portion of the word line WL. An upper surface of the gate capping layer 125 may be positioned on a level substantially the same as that of the upper surface of the substrate 101. The gate capping layer 125 may be formed of an insulating material, for example, silicon nitride.

The bit line structure BLS may extend in a direction, perpendicular to the word line WL, for example, a second direction Y. The bit line structure BLS may include a bit line BL and a bit line capping pattern BC on the bit line BL.

The bit line BL may include a first conductive pattern 141, a second conductive pattern 142, and a third conductive pattern 143 that are sequentially stacked. The bit line capping pattern BC may be disposed on the third conductive pattern 143. A buffer insulating layer 128 may be disposed between the first conductive pattern 141 and the substrate 101, and a portion of the first conductive pattern 141 (hereinafter, a bit line contact pattern DC) may be in contact with the first impurity region **105*a* of the active region ACT. The bit line BL may be electrically connected to the first impurity region 105*a* through the bit line contact pattern DC. A lower surface of the bit line contact pattern DC may be positioned on a level lower than that of the upper surface of the substrate 101, and may be positioned on a level higher than that of the upper surface of the word line WL. In some example embodiments, the bit line contact pattern DC may be formed in the substrate 101 to be locally disposed in a bit line contact hole exposing the first impurity region 105*a***.

The first conductive pattern 141 may include a semiconductor material such as polycrystalline silicon. The first conductive pattern 141 may be in direct contact with the first impurity region **105*a*. The second conductive pattern 142 may include a metal-semiconductor compound. The metal-semiconductor compound may be, for example, a layer obtained by silicidating a portion of the first conductive pattern 141. For example, the metal-semiconductor compound may include cobalt silicide (CoSi), titanium silicide (TiSi), nickel silicide (NiSi), tungsten silicide (WSi), or other metal silicide. The third conductive pattern 143** may include a metal material such as titanium (Ti), tantalum (Ta), tungsten (W), and aluminum (Al). In some example embodiments, the number of conductive patterns forming the bit line BL, a type of material, and/or a stacking order may be changed in various manners.

The bit line capping pattern BC may include a first capping pattern 146, a second capping pattern 147, and a third capping pattern 148 sequentially stacked on the third conductive pattern 143. Each of the first to third capping patterns 146, 147, and 148 may include an insulating material, for example, a silicon nitride film. The first to third capping patterns 146, 147, and 148 may be formed of different materials. Even when the first to third capping patterns 146, 147, and 148 include the same material, the first to third capping patterns 146, 147, and 148 may be distinguished from each other by a difference in physical properties. A thickness of the second capping pattern 147 may be narrower than a thickness of the first capping pattern 146 and a thickness of the third capping pattern 148, respectively. In some example embodiments, the number of capping patterns and/or a type of material forming the bit line capping pattern BC may be changed in various manners.

Spacer structures SS may be disposed on opposite sidewalls of each of the bit line structures BLS to extend in a direction, for example, a Y-direction. The spacer structures SS may be disposed between the bit line structure BLS and the lower conductive pattern 150. The spacer structures SS may extend along sidewalls of the bit line BL and sidewalls of the bit line capping pattern BC. A pair of spacer structures SS disposed on opposite sides of one bit line structure BLS may have an asymmetric shape with respect to the bit line structure BLS. Each of the spacer structures SS may include a plurality of spacer layers, and may further include an air spacer in some example embodiments.

The lower conductive pattern 150 may be connected to a region of the active region ACT, for example, the second impurity region **105*b*. The lower conductive pattern 150 may be disposed between the bit lines BL and between the word lines WL. The lower conductive pattern 150 may pass through the buffer insulating layer 128 to be connected to the second impurity region 105*b* of the active region ACT. The lower conductive pattern 150 may be in direct contact with the second impurity region 105*b*. A lower surface of the lower conductive pattern 150 may be positioned on a level lower than that of the upper surface of the substrate 101, and may be positioned on a level higher than that of the lower surface of the bit line contact pattern DC. The lower conductive pattern 150 may be insulated from the bit line contact pattern DC by the spacer structure SS. The lower conductive pattern 150 may be formed of a conductive material. For example, the lower conductive pattern 150 may include at least one of polycrystalline silicon (Si), titanium (Ti), titanium nitride (TiN), tantalum (Ta), tantalum nitride (TaN), tungsten (W), tungsten nitride (WN), and aluminum (Al). In some example embodiments, the lower conductive pattern 150** may include a plurality of layers.

A metal-semiconductor compound layer 155 may be disposed between the lower conductive pattern 150 and the upper conductive pattern 160. The metal-semiconductor compound layer 155 may be, for example, a layer obtained by silicidating a portion of the lower conductive pattern 150 when the lower conductive pattern 150 includes a semiconductor material. The metal-semiconductor compound layer 155 may include, for example, cobalt silicide (CoSi), titanium silicide (TiSi), nickel silicide (NiSi), tungsten silicide (WSi), or other metal silicide. In some example embodiments, the metal-semiconductor compound layer 155 may be omitted.

The upper conductive pattern 160 may be disposed on the lower conductive pattern 150. The upper conductive pattern 160 may extend between the spacer structures SS to cover an upper surface of the metal-semiconductor compound layer 155. The upper conductive pattern 160 may include a barrier layer 162 and a conductive layer 164. The barrier layer 162 may cover a lower surface and side surfaces of the conductive layer 164. The barrier layer 162 may include a metal nitride, for example, at least one of titanium nitride (TiN), tantalum nitride (TaN), and tungsten nitride (WN). The conductive layer 164 may include a conductive material, for example, at least one of polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), and tungsten nitride (WN).

Insulating patterns 165 may pass through the upper conductive pattern 160. The upper conductive pattern 160 may be divided into a plurality of upper conductive patterns by the insulating patterns 165. The insulating patterns 165 may include an insulating material, for example, at least one of silicon oxide, silicon nitride, and silicon oxynitride.

The etch-stop layer 168 may cover the insulating patterns 165 between the lower electrodes 170. The etch-stop layer 168 may be in contact with lower regions of side surfaces of the lower electrodes 170. The etch-stop layer 168 may be disposed below the supporter layers SP1 and SP2. An upper surface of the etch-stop layer 168 may include a portion in direct contact with the dielectric layer stack 180. The etch-stop layer 168 may include, for example, at least one of silicon nitride and silicon oxynitride.

The lower electrodes 170 may be disposed on the upper conductive patterns 160. The lower electrodes 170 may pass through the etch-stop layer 168 to be in contact with the upper conductive patterns 160. The lower electrodes 170 may have a cylindrical shape, but are not limited thereto. In some example embodiments, the lower electrodes 170 may have a hollow cylinder or cup shape, or a planar shape. At least one of the supporter layers SP1 and SP2 supporting the lower electrodes 170 may be provided between the adjacent lower electrodes 170. For example, a first supporter layer SP1 and a second supporter layer SP2 in contact with the lower electrodes 170 may be provided between the adjacent lower electrodes 170. The lower electrodes 170 may include at least one of polycrystalline silicon (Si), titanium (Ti), titanium nitride (TiN), tantalum (Ta), tantalum nitride (TaN), tungsten (W), tungsten nitride (WN), and aluminum (Al).

Referring to FIGS. 1A and 1B, in a plan view viewed from above, the lower electrodes 170 may have a regular arrangement. In some example embodiments, the lower electrodes 170 may be spaced apart from each other by a desired (or alternatively, predetermined) distance in the first direction X, and may be disposed in a zigzag pattern in the second direction Y. However, the arrangement of the lower electrodes 170 is not limited thereto.

A through-hole pattern may be disposed between the plurality of adjacent lower electrodes 170. In some example embodiments, as illustrated in the semiconductor device 100 of FIG. 1A, one through-hole pattern may be disposed between four adjacent lower electrodes 170. In some example embodiments, as illustrated in a semiconductor device 100' of FIG. 1B, one through-hole pattern may be disposed between three adjacent lower electrodes 170. However, the through-hole pattern is not limited thereto. For example, one through-hole pattern may be disposed between six adjacent lower electrodes 170.

The supporter layers SP1 and SP2 may include a first supporter layer SP1 and a second supporter layer SP2 on the first supporter layer SP1. The supporter layers SP1 and SP2 may be spaced apart from the substrate 101 in a direction, perpendicular to the upper surface of the substrate 101. The supporter layers SP1 and SP2 may be in contact with the lower electrodes 170, and may extend in a direction, parallel to the upper surface of the substrate 101. The supporter layers SP1 and SP2 may include a portion in direct contact with the lower electrodes 170 and the dielectric layer stack 180. The second supporter layer SP2 may have a thickness greater than that of the first supporter layer SP1, but the present disclosure is not limited thereto. The supporter layers SP1 and SP2 may be layers supporting the lower electrodes 170 having a high aspect ratio. Each of the supporter layers SP1 and SP2 may include, for example, at least one of silicon nitride and silicon oxynitride, or a material similar thereto. The number and thicknesses of the supporter layers SP1 and SP2, and/or an arrangement relationship between the supporter layers SP1 and SP2 are not limited to those illustrated in the drawings, and may be changed in various manners in some example embodiments.

The dielectric layer stack 180 may cover the lower electrodes 170 on surfaces of the lower electrodes 170. The dielectric layer stack 180 may be disposed between the lower electrodes 170 and the upper electrode 190. The dielectric layer stack 180 may cover upper and lower surfaces of the supporter layers SP1 and SP2. The dielectric layer stack 180 may cover the upper surface of the etch-stop layer 168.

Referring to FIGS. 2 and 3, the dielectric layer stack 180 may include the first dielectric layer 181 and the second dielectric layer 182. In some example embodiments, the first dielectric layer 181 may be in contact with the lower electrodes 170 and the supporter layers SP1 and SP2. The first dielectric layer 181 may cover surfaces of the lower electrodes 170 and upper and lower surfaces of the supporter layers SP1 and SP2. The second dielectric layer 182 may be disposed on the first dielectric layer 181. The second dielectric layer 182 may be in contact with the upper electrode 190. In some example embodiments, the second dielectric layer 182 may be in contact with the first upper electrode layer 191 of the upper electrode 190.

The second dielectric layer 182 may be formed of a material having ferroelectricity. In some example embodiments, the second dielectric layer 182 may include at least one of hafnium oxide ($HfO_2$), hafnium zirconium oxide (HfxZr1-xO2, 0.5≤x<1), hafnium oxide ($HfO_2$) doped with silicon (Si), hafnium oxide ($HfO_2$) doped with lanthanum (La), and hafnium oxide ($HfO_2$) doped with yttrium (Y). In some example embodiments, the second dielectric layer 182 may be formed of a material having a perovskite crystal structure. The second dielectric layer 182 may include, for example, at least one of $BaTiO_3$, BiFeO, $PbTiO_3$, $PbZr_xTi_{1-x}O_3$($0<x<1$), and $SrTiO_3$.

The first dielectric layer 181 may be formed of a material different from that of the second dielectric layer 182. The first dielectric layer 181 may be formed of a material having anti-ferroelectricity or paraelectricity. In some example embodiments, the first dielectric layer 181 may be formed by stacking or doping one or more of a material having anti-ferroelectricity, a material having ferroelectricity, and a material having paraelectricity. The first dielectric layer 181 may be formed of, for example, hafnium zirconium oxide ($Hf_xZr_{1-x}O_2$, $0<x<0.5$).

The first dielectric layer 181 and the second dielectric layer 182 may have a first thickness t1 and a second thickness t2, respectively. The first dielectric layer 181 may have the first thickness t1 greater than the second thickness t2 of the second dielectric layer 182. In some example embodiments, the second thickness t2 of the second dielectric layer 182 may have a range of about 5 Å to about 20 Å. When the second thickness t2 of the second dielectric layer 182 has the range, a storage capacity of the capacitor structure CAP may be sufficiently secured while ferroelectric properties of the second dielectric layer 182 are secured. An overall thickness of the dielectric layer stack 180 may not exceed about 60 Å.

The upper electrode 190 may cover the plurality of lower electrodes 170, the supporter layers SP1 and SP2, and the dielectric layer stack 180. The upper electrode 190 may fill a space between the plurality of lower electrodes 170 and a space between the supporter layers SP1 and SP2. The upper electrode 190 may be in direct contact with the dielectric layer stack 180.

The upper electrode 190 may include the first upper electrode layer 191 and the second upper electrode layer 192. In some example embodiments, the first upper electrode layer 191 may be disposed to be in contact with the second dielectric layer 182 of the dielectric layer stack 180, and the second upper electrode layer 192 may be disposed on the first upper electrode layer 191. As illustrated in FIG. 2, the second upper electrode layer 192 may be formed of a single conductive layer, but the present disclosure is not limited thereto. In some example embodiments, the second upper electrode layer 192 may include a plurality of conductive layers.

The upper electrode 190 may include a conductive material. The second upper electrode layer 192 may be formed of a conductive material, and the first upper electrode layer 191 may be formed of a conductive material doped with an impurity. In some example embodiments, the second upper electrode layer 192 may include a first metal having a first valence. The first upper electrode layer 191 may include, in addition to the first metal, a second metal having a second valence greater than the first valence. For example, the second upper electrode layer 192 may include a tetravalent metal element, and the first upper electrode layer 191 may include a tetravalent metal element and an N-type impurity having a valence of 5 or more. The first upper electrode layer 191 and the second upper electrode layer 192 may include, for example, at least one of polycrystalline silicon (Si), titanium (Ti), and titanium nitride (TiN). The first upper electrode layer 191 may further include at least one of niobium (Nb), vanadium (V), and tantalum (Ta), as an N-type impurity. However, the conductive material and the N-type impurity included in the upper electrode 190 are not limited thereto. In some example embodiments, the first upper electrode layer 191 and the second upper electrode layer 192 may include, as a metal nitride, niobium nitride (NbN), chromium nitride (CrN), molybdenum nitride (MoN), or the like, may include, as a noble metal, platinum (Pt), ruthenium (Ru), gold (Au), iridium (Ir), or the like, or may include, as a metal oxide, ruthenium oxide ($RuO_x$), iridium oxide ($IrO_x$), or the like. The first upper electrode layer 191 may include an N-type impurity in addition to the above-described conductive material.

A concentration of the N-type impurity included in the first upper electrode layer 191 may be in a range of about 2 at % to about 10 at % with respect to the total number of atoms of the dielectric layer stack 180 and the first upper electrode layer 191. The first upper electrode layer 191 may effectively control a leakage current by containing about 2 at % or more of the N-type impurity, and may secure sufficient capacitance by containing about 10 at % or less of the N-type impurity.

The semiconductor device 100 may include the second dielectric layer 182 having ferroelectricity and the first upper electrode layer 191 including the N-type impurity to adjust a polarization direction in the second dielectric layer 182, thereby reducing a leakage current. Referring to FIG. 3 together, FIG. 3 illustrates a charge formed in each layer and energy band diagrams of the second dielectric layer 182 and the first upper electrode layer 191, when a voltage is applied to the lower electrode 170. For example, when a negative voltage is applied to the lower electrode 170, a negative charge may be formed on a surface of the lower electrode 170 in contact with the first dielectric layer 181. A positive charge may be formed on a surface of the first dielectric layer 181 in contact with the lower electrode 170, and a negative charge may be formed on a surface of the first dielectric layer 181 in contact with the second dielectric layer 182. The polarization direction of the second dielectric layer 182 may be aligned toward the first dielectric layer 181 according to a voltage direction. A positive charge may be formed on a surface of the second dielectric layer 182 in contact with the first dielectric layer 181, and a negative charge may be formed on a surface of the second dielectric layer 182 in contact with the first upper electrode layer 191. A positive charge may be formed in the first upper electrode layer 191 including the N-type impurity to form a depletion region. Due to the depletion region formed in the first upper electrode layer 191, an energy barrier height $\phi$ between the second dielectric layer 182 and the first upper electrode layer 191 may be increased. Accordingly, a leakage current of the capacitor structure CAP may be reduced.

Respective layers forming the lower electrode 170, the dielectric layer stack 180, and the upper electrode 190 may have different material compositions, and thus may be practically distinguished from each other through analysis such as transmission electron microscopy energy-dispersive x-ray spectroscopy (TEM-EDS), or the like.

Figure 4:
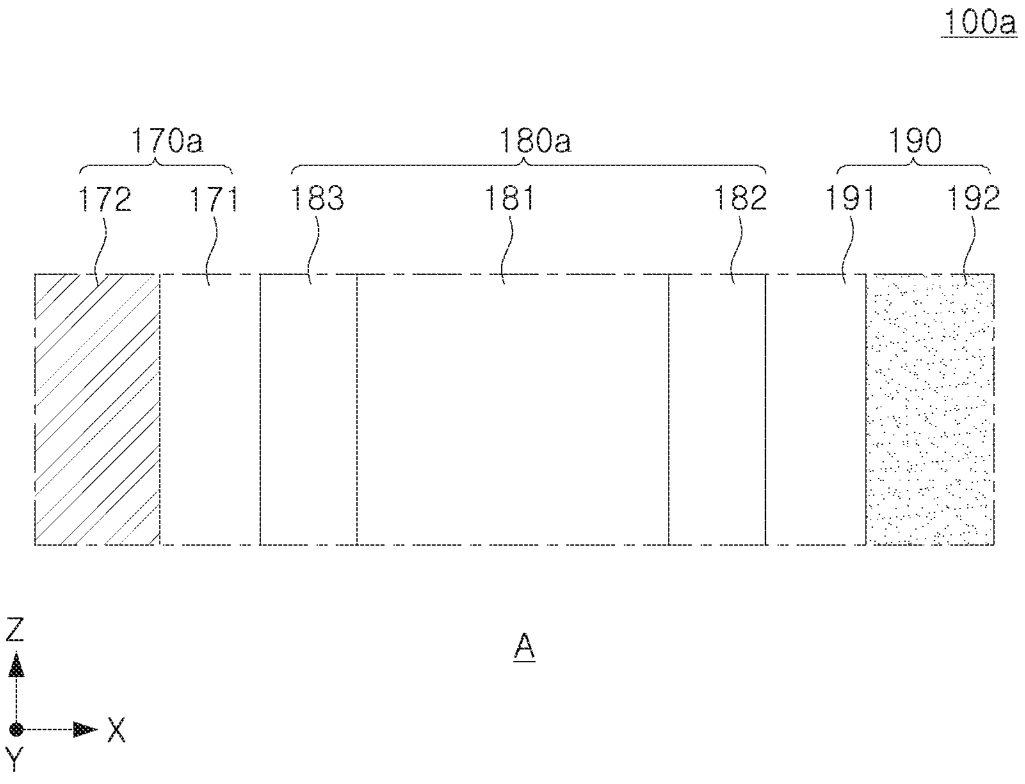
FIG. 4 is a partially enlarged view illustrating a portion of a semiconductor device according to an example embodiment.
Figure 5:
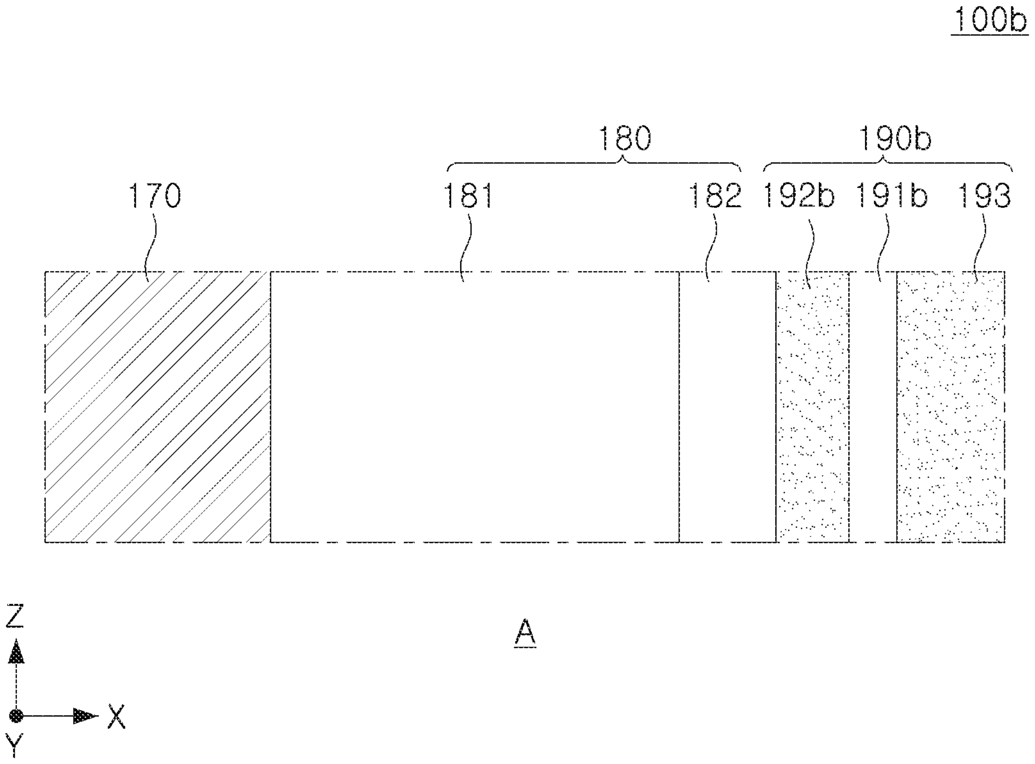
FIG. 5 is a partially enlarged view illustrating a portion of a semiconductor device according to an example embodiment.
Figure 6:
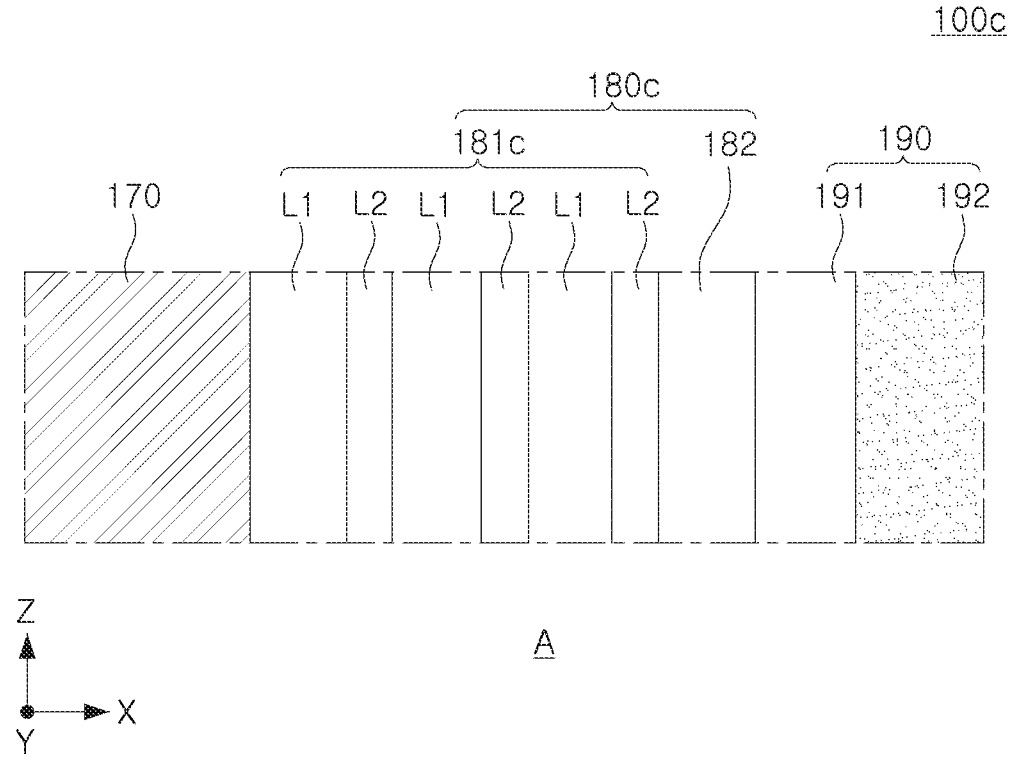
FIG. 6 is a partially enlarged view illustrating a portion of a semiconductor device according to an example embodiment.

FIGS. 4 to 6 are partially enlarged cross-sectional views illustrating a partial region of a capacitor of a semiconductor device according to an example embodiment. FIGS. 4 to 6 illustrate a region corresponding to FIG. 3.

In the example embodiments of FIGS. 4 to 6, components indicated by different alphabets despite having the same reference numerals as those of FIGS. 1A to 3 are for describing an example embodiment different from those of FIGS. 1A to 3, and components having the same reference numerals may have features the same as or similar to the above-described features.

Referring to FIG. 4, a semiconductor device **100*a* may be different from the semiconductor device 100 of FIGS. 1A to 3 in terms of structures of a lower electrode 170*a* and a dielectric layer stack 180*a***.

The semiconductor device **100*a* may include the lower electrode 170*a*, the dielectric layer stack 180*a*, and the upper electrode 190. The dielectric layer stack 180*a* may include the first dielectric layer 181, the second dielectric layer 182 disposed between the first dielectric layer 181 and the upper electrode 190, and a third dielectric layer 183 disposed between the first dielectric layer 181 and the lower electrodes 170. The second dielectric layer 182 and the third dielectric layer 183 may be formed of a material having ferroelectricity. The first dielectric layer 181** may be formed of a material having anti-ferroelectricity or paraelectricity.

The upper electrode 190 may include the first upper electrode layer 191 in contact with the second dielectric layer 182, and the second upper electrode layer 192 disposed on the first upper electrode layer 191. The lower electrode **170*a* may include a first lower electrode layer 171 in contact with the third dielectric layer 183, and a second lower electrode layer 172 disposed on the first lower electrode layer 171. Each of the first upper electrode layer 191 of the upper electrode 190 and the first lower electrode layer 171 of the lower electrode 170 may be formed of a conductive material doped with an N-type impurity. In some example embodiments, each of the first upper electrode layer 191 and the first lower electrode layer 171 may be formed of titanium nitride (TiN) doped with at least one impurity of niobium (Nb), vanadium (V), and tantalum (Ta). However, the conductive material and the N-type impurity included in the first upper electrode layer 191 and the first lower electrode layer 171** are not limited thereto.

Referring to FIG. 5, a semiconductor device 100*b* may be different from the semiconductor device 100 of FIGS. 1A to 3 in terms of a structure of an upper electrode 190*b*.

The upper electrode 190*b* of the semiconductor device 100*b* may include a first upper electrode layer 191*b*, a second upper electrode layer 192*b*, and a third upper electrode layer 193. The second upper electrode layer 192*b* and the third upper electrode layer 193 may be formed of a conductive material, and the first upper electrode layer 191*b* may be formed of a conductive material including an N-type impurity. The first upper electrode layer 191*b* may be disposed between the second upper electrode layer 192*b* and the third upper electrode layer 193. The second upper electrode layer 192*b* may be disposed between the second dielectric layer 182 and a first surface of the first upper electrode layer 191*b*, and the third upper electrode layer 193 may be disposed on a second surface opposing the first surface of the first upper electrode layer 191*b*. The third upper electrode layer 193 may be spaced apart from the second upper electrode layer 192*b*. The second upper electrode layer 192*b* and the third upper electrode layer 193 may be formed of the same conductive material or different materials.

The second upper electrode layer 192*b* and the third upper electrode layer 193 may have different thicknesses in an X-direction. For example, a thickness of the third upper electrode layer 193 may be about twice a thickness of the second upper electrode layer 192*b*. However, the thicknesses of the second upper electrode layer 192*b* and the third upper electrode layer 193 are not limited thereto. The second upper electrode layer 192*b* may have a thickness substantially the same as that of the third upper electrode layer 193, or may have a thickness greater than that of the third upper electrode layer 193.

Referring to FIG. 6, a semiconductor device 100*c* may be different from the semiconductor device 100 of FIGS. 1A to 3 in terms of a shape of a dielectric layer stack 180*c*.

The dielectric layer stack 100*c* may include a first dielectric layer 181*c* having anti-ferroelectricity or paraelectricity, and the second dielectric layer 182 having ferroelectricity. The first dielectric layer 181*c* may include a plurality of unit layers L1 and L2 formed of different materials. In some example embodiments, the first dielectric layer 181*c* may include a first unit layer L1 and a second unit layer L2 that are alternately and repeatedly stacked. The first unit layer L1 may be, for example, a zirconium oxide ($ZrO_2$) layer, and the second unit layer L2 may be, for example, a hafnium oxide ($HfO_2$) layer. In the first dielectric layer 181*c*, a concentration of zirconium (Zr) may be greater than a concentration of hafnium (Hf). For example, a thickness of the first unit layer L1 may be greater than a thickness of the second unit layer L2. The second dielectric layer 182 may be, for example, a hafnium oxide ($HfO_2$) layer or a hafnium zirconium oxide ($Hf_xZr_{1-x}O_2$, where x is 0.5 or more and less than 1) layer.

FIGS. 7A to 7F are cross-sectional views illustrating a method of manufacturing a semiconductor device according to an example embodiment. FIGS. 7A to 7F illustrate cross-sections corresponding to I-I' and II-II' of FIG. 2.

Figure 7A:
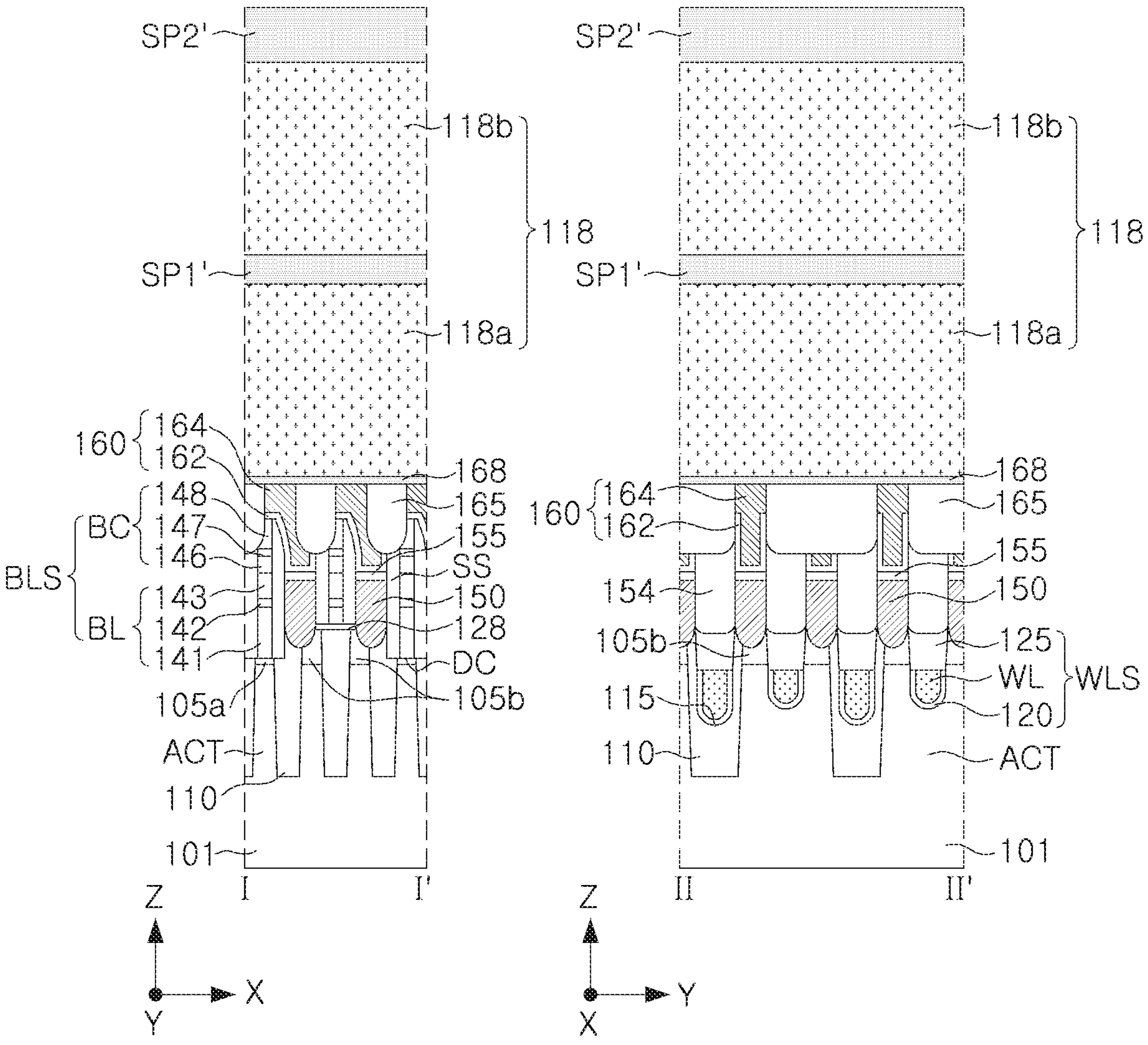
FIGS. 7A to 7F are cross-sectional views illustrating a process order so as to explain a method of manufacturing a semiconductor device according to an example embodiment.

Referring to FIG. 7A, the isolation layer 110 may be formed on the substrate 101 to define the active region ACT. An isolation trench may be formed in the substrate 101, and the isolation layer 110 may fill the isolation trench. In a plan view, the active region ACT may have an elongated bar shape extending in a direction, oblique to an extension direction of the word line WL. Impurity regions may be formed on an upper portion of the active region ACT by performing an ion implantation process using the isolation layer 110 as an ion implantation mask. The active region ACT and the isolation layer 110 may be patterned to form the gate trench 115. A pair of gate trenches 115 may cross the active region ACT, but the present disclosure is not limited thereto. The impurity regions may also be isolated from each other by the gate trench 115 to form a first impurity region 105*a* and a second impurity region 105*b*.

The gate dielectric layer 120 may be formed on an inner surface of the gate trench 115 to have a substantially conformal thickness. Subsequently, the word line WL may be formed to fill at least a portion of the gate trench 115. An upper surface of the word line WL may be recessed to be lower than an upper surface of the active region ACT. A gate capping layer 125 may be formed on the word line WL by stacking an insulating layer on the substrate 101 to fill the gate trench 115 and etching the insulating layer.

An insulating layer and a conductive layer may be sequentially formed and patterned on a front surface of the substrate 101 to form the sequentially stacked buffer insulating layer 128 and the first conductive pattern 141. The buffer insulating layer 128 may be formed of at least one of silicon oxide, silicon nitride, and silicon oxynitride. A plurality of buffer insulating layers 128 may be spaced apart from each other. The first conductive pattern 141 may have a shape corresponding to a planar shape of the buffer insulating layer 128. The buffer insulating layer 128 may simultaneously cover ends of two adjacent active regions ACT (e.g., each of two adjacent second impurity regions 105*b*). A bit line contact hole may be formed by etching upper portions of the isolation layer 110, the substrate 101, and the gate capping layer 125 using the buffer insulating layer 128 and the first conductive pattern 141 as an etching mask. The bit line contact hole may expose the first impurity region 105*a*.

The bit line contact pattern DC, filling the bit line contact hole, may be formed. Forming the bit line contact pattern DC may include forming a conductive layer filling the bit line contact hole, and performing a planarization process. For example, the bit line contact pattern DC may be formed of polysilicon. After sequentially forming the second conductive pattern 142, the third conductive pattern 143, and the first to third capping patterns 146, 147, and 148 on the first conductive pattern 141, the first to third conductive patterns 141, 142, and 143 may be sequentially etched using the first to third capping patterns 146, 147, and 148 as an etching mask. Thus, a bit line structure BLS, including the bit line BL including the first to third conductive patterns 141, 142, and 143 and the bit line capping pattern BC including the first to third capping patterns 146, 147, and 148, may be formed.

The spacer structure SS may be formed on side surfaces of the bit line structure BLS. The spacer structure SS may be formed of a plurality of layers. Fence insulating patterns 154 may be formed between the spacer structures SS. The fence insulating patterns 154 may include silicon nitride or silicon oxynitride. An opening exposing the second impurity region 105*b* may be formed by performing an anisotropic etching process using the fence insulating patterns 154 and the third capping pattern 148 as an etching mask.

A lower conductive pattern 150 may be formed on a lower portion of the opening. The lower conductive pattern 150 may be formed of a semiconductor material such as polysilicon. For example, the lower conductive pattern 150 may be formed by forming a polysilicon layer filling the opening, and then performing an etch-back process.

The metal-semiconductor compound layer 155 may be formed on the lower conductive pattern 150. The formation of the metal-semiconductor compound layer 155 may include a metal layer deposition process and a heat treatment process.

An upper conductive pattern 160 may be formed on an upper portion of the opening. Forming the upper conductive pattern 160 may include sequentially forming the barrier layer 162 and the conductive layer 164. Thereafter, a patterning process may be performed on the barrier layer 162 and the conductive layer 164 to form the insulating patterns 165 passing therethrough. Accordingly, a lower structure, including the substrate 101, the word line structure WLS, and the bit line structure BLS, may be formed.

An etch-stop layer 168 may be conformally formed on the lower structure, and mold layers 118 and preliminary supporter layers SP1' and SP2' may be alternately stacked on the etch-stop layer 168. The etch-stop layer 168 may include an insulating material (e.g., at least one of silicon oxide, silicon nitride, silicon carbide, silicon oxycarbide, and silicon carbonitride) having an etch selectivity with respect to the mold layers 118 under a specific etch condition. The mold layers 118 may include a first mold layer 118*a* and a second mold layer 118*b* on the first mold layer 118*a*. The first preliminary supporter layer SP1' may be formed between the first mold layer 118*a* and the second mold layer 118*b*, and the second preliminary supporter layer SP2' may be formed on the second mold layer 118*b*. For example, the mold layers 118 may be formed of silicon oxide, and the preliminary supporter layers SP1' and SP2' may be formed of silicon nitride.

Figure 7B:
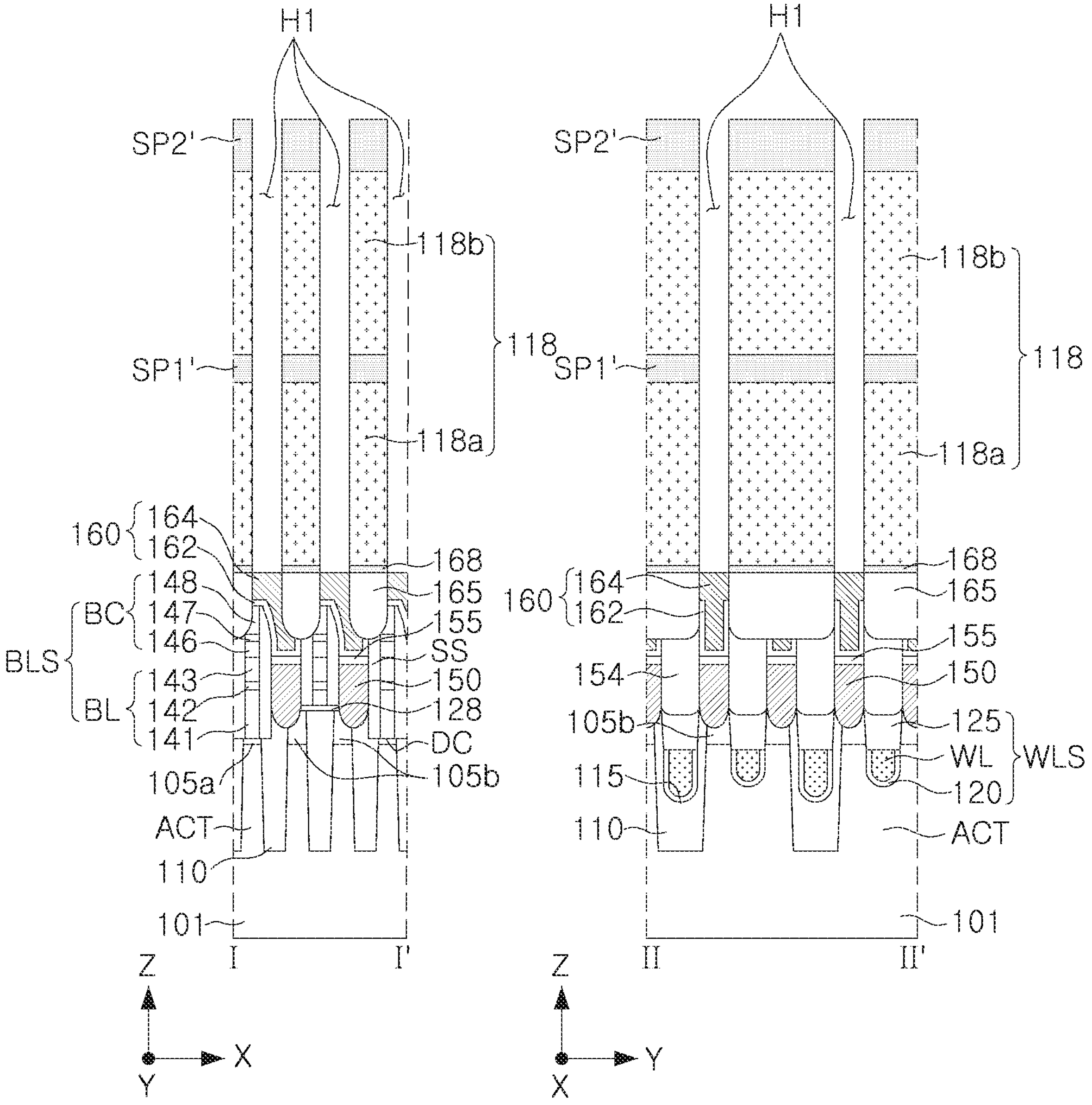

Referring to FIG. 7B, a plurality of holes H1, passing through the mold layers 118 and the preliminary supporter layers SP1' and SP2', may be formed. In an operation of forming the plurality of holes H1, the etch-stop layer 168 may serve as a stopper for stopping an etching process. The plurality of holes H1 may pass through the etch-stop layer 168 to expose the upper conductive patterns 160. The plurality of holes H1, regions in which the lower electrodes 170 are to be formed, may be spaced apart from each other at desired (or alternatively, predetermined) intervals on a plane so as to be formed in a regular arrangement, as illustrated in FIGS. 1A and 1B.

Figure 7C:
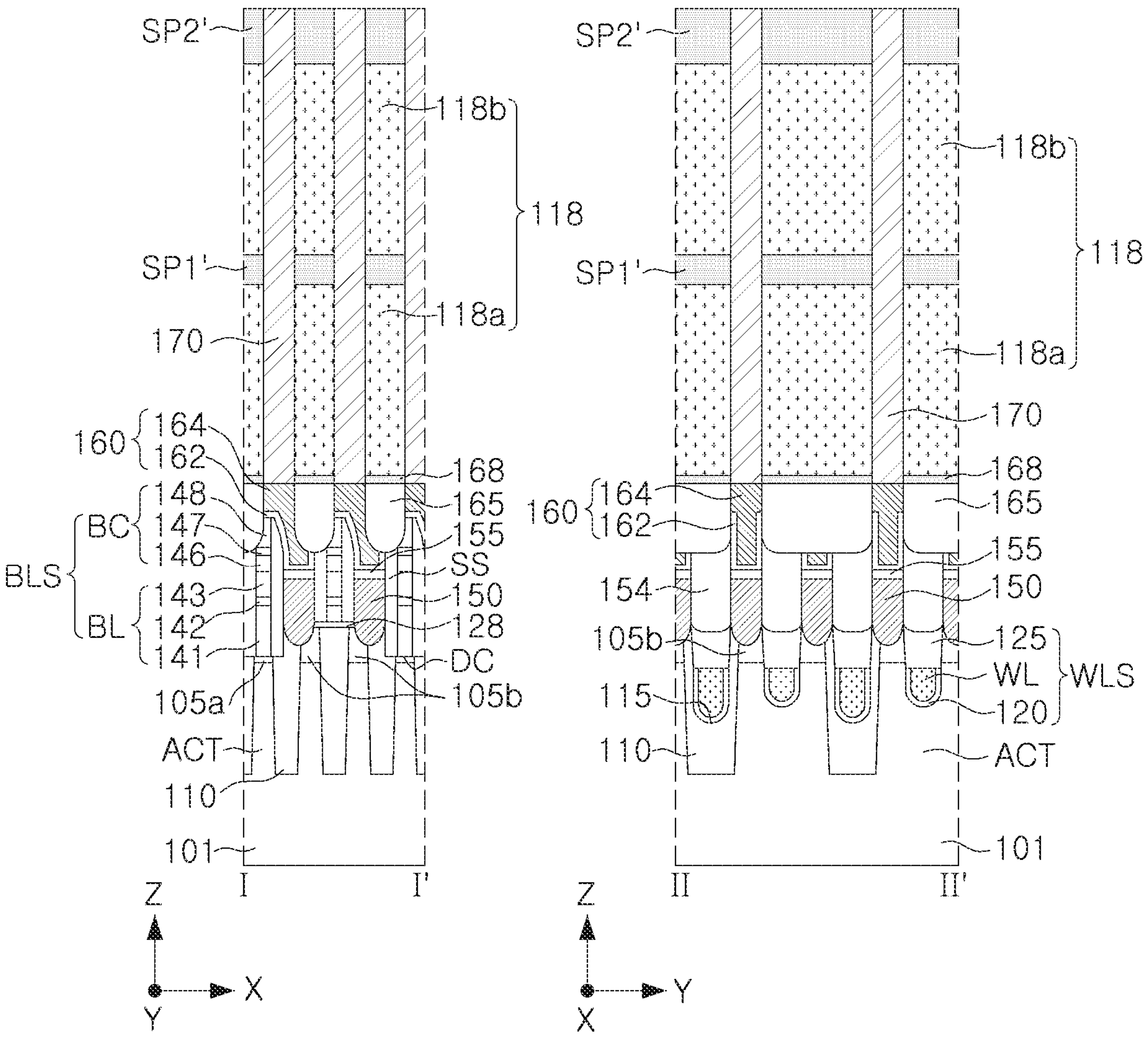

Referring to FIG. 7C, the lower electrodes 170 may be formed by filling the plurality of holes H1 with a conductive material. The lower electrodes 170 may be connected to the upper conductive pattern 160 at lower ends of the plurality of holes H1. Forming the lower electrodes 170 may include forming a conductive material layer in the plurality of holes H1 and on the plurality of holes H1, and performing a planarization process, for example, a chemical mechanical polishing (CMP) process on the conductive material layer. Thus, the lower electrodes 170 may have a plurality of patterns spaced apart from each other by node isolation. The conductive material layer may be formed using, for example, an atomic layer deposition (ALD) process. A deposition temperature of the conductive material layer may be, for example, from about 450° C. to about 700° C.

Figure 7D:
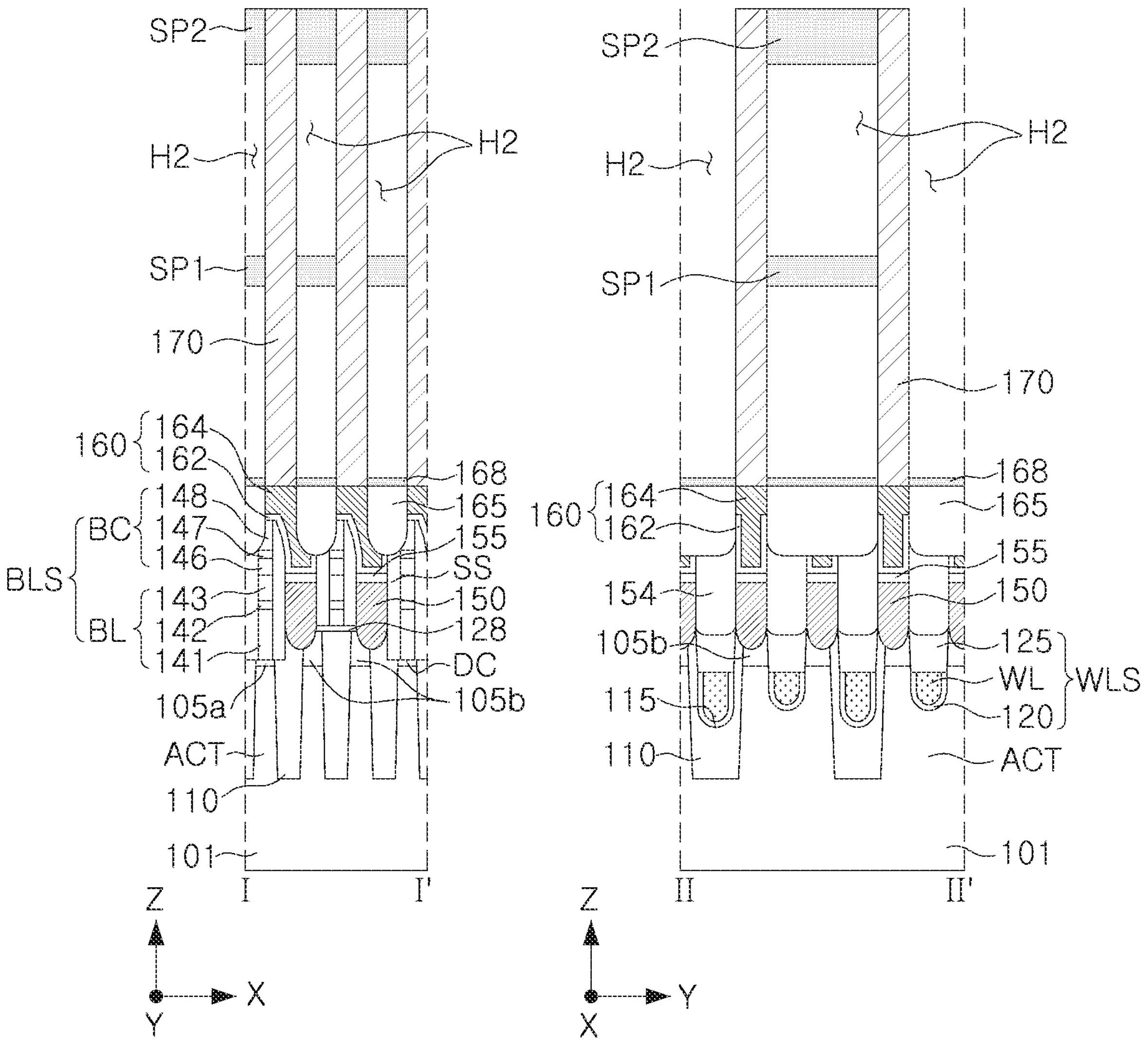

Referring to FIG. 7D, a mask may be formed on the second preliminary supporter layer SP2', and at least portions of the mold layers 118 and the preliminary supporter layers SP1' and SP2' may be removed using the mask. Accordingly, the preliminary supporter layers SP1' and SP2' may be formed of the first and second supporter layers SP1 and SP2. The first and second supporter layers SP1 and SP2 may be patterned according to a structure of the mask to have a shape including a plurality of openings. The plurality of openings may be disposed between four adjacent lower electrodes 170 as illustrated in FIG. 1A, or may be disposed between three adjacent lower electrodes 170 as illustrated in FIG. 1B. The first and second supporter layers SP1 and SP2 may connect the adjacent lower electrodes 170 to each other. The mold layers 118 may be selectively removed with respect to the supporter layers SP1 and SP2. The mask may be removed after etching the mold layers 118, or while etching the mold layers 118. An empty space H2 may be formed in a region from which the mold layers 118 are removed.

Figure 7E:
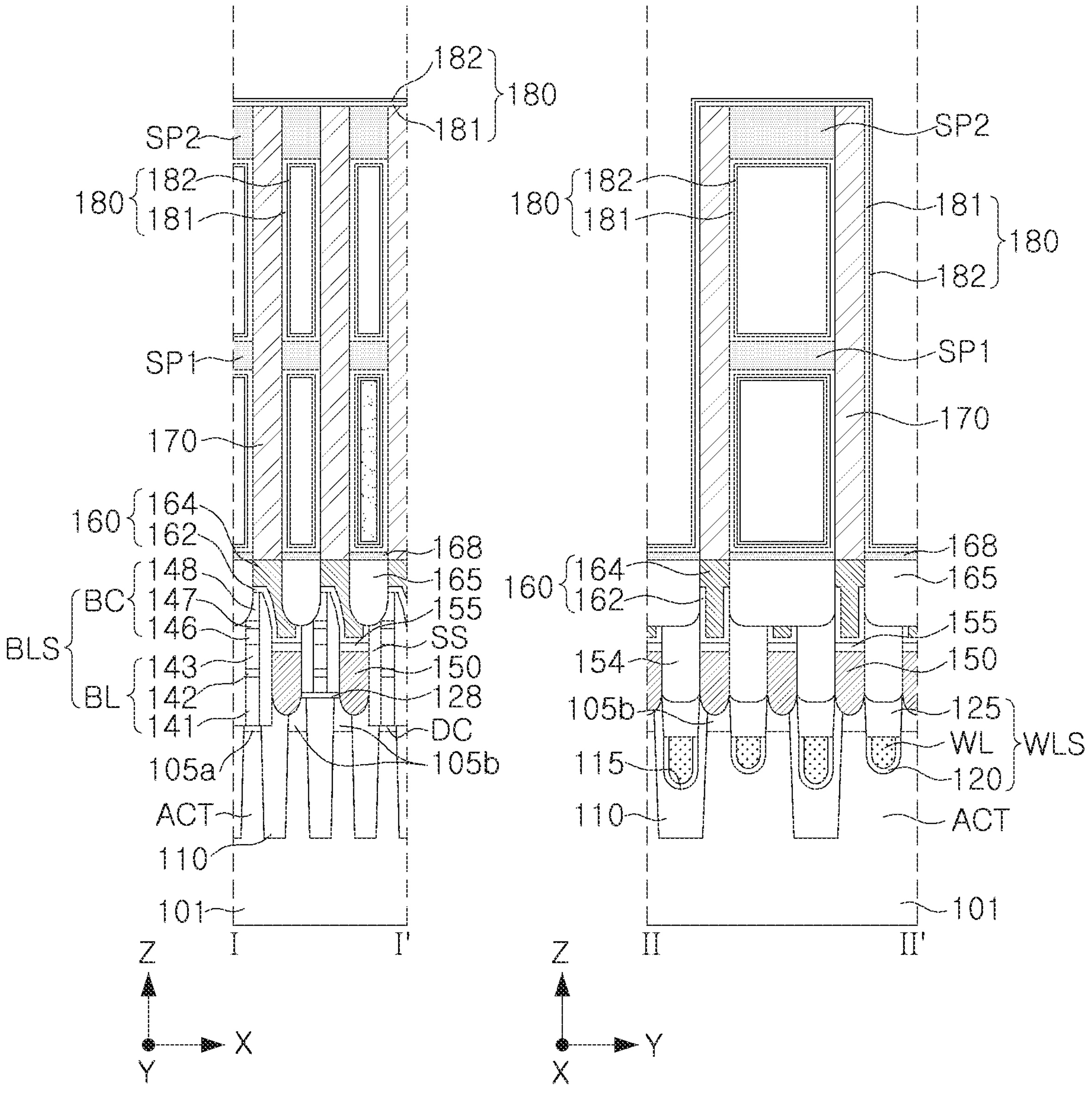

Referring to FIG. 7E, the dielectric layer stack 180, covering the lower electrodes 170 and the supporter layers SP1 and SP2, may be formed in the empty space H2.

Forming the dielectric layer stack 180 may include forming the first dielectric layer 181 covering the lower electrodes 170 and the supporter layers SP1 and SP2, and forming the second dielectric layer 182 on the first dielectric layer 181. The first dielectric layer 181 and the second dielectric layer 182 may be formed using, for example, an ALD process.

First, the first dielectric layer 181 may be formed on surfaces of the lower electrodes 170 and upper and lower surfaces of the supporter layers SP1 and SP2 using an ALD process. The first dielectric layer 181 may be formed of a material having anti-ferroelectricity or paraelectricity. In some example embodiments, the first dielectric layer 181 may be formed of hafnium zirconium oxide ($Hf_xZr_{1-x}O_2$, where x is greater than 0 and less than 0.5). Thereafter, the second dielectric layer 182 may be formed on the first dielectric layer 181 using an ALD process. The second dielectric layer 182 may be formed of a material having ferroelectricity. In some example embodiments, the second dielectric layer 182 may be formed of hafnium oxide ($HfO_2$) or hafnium zirconium oxide ($Hf_xZr_{1-x}O_2$, where x is 0.5 or more and less than 1). The deposition of the first dielectric layer 181 and the second dielectric layer 182 may be performed at a temperature of about 400° C. or less.

After the first dielectric layer 181 and the second dielectric layer 182 are formed using an ALD process, an annealing process may be additionally performed on the first dielectric layer 181 and the second dielectric layer 182. The annealing process may be performed, for example, at a temperature ranging from about 200° C. to about 700° C. The second dielectric layer 182 may be formed to have a thickness less than that of the first dielectric layer 181. For example, the second dielectric layer 182 may be formed to have a thickness of about 5 Å to about 20 Å, and a total thickness of the dielectric layer stack 180 may not exceed about 60 Å.

Figure 7F:
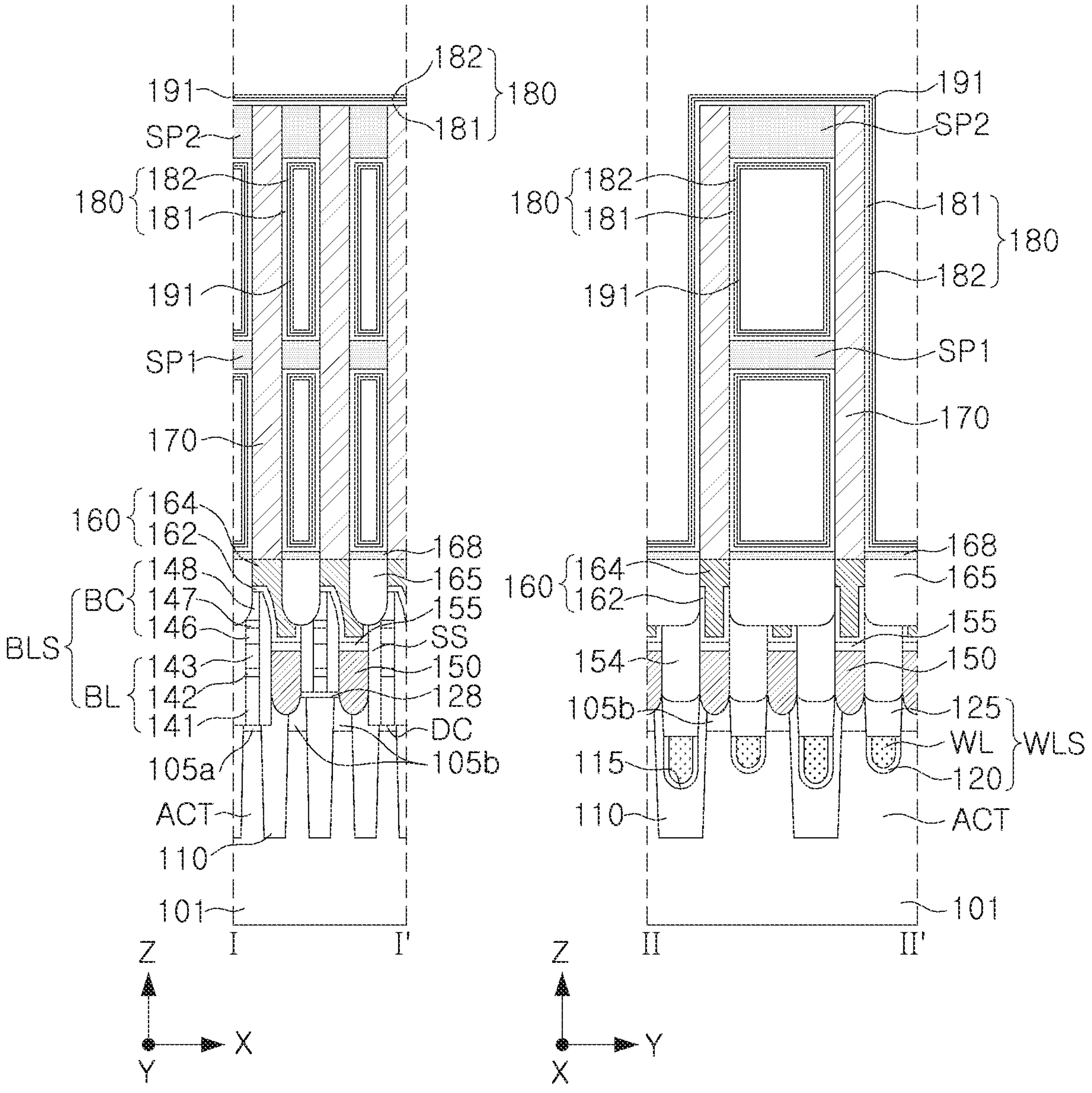

Referring to FIG. 7F, the first upper electrode layer 191 may be formed on the dielectric layer stack 180.

The first upper electrode layer 191 may be formed of a conductive material doped with an N-type impurity. In some example embodiments, the first upper electrode layer 191 may include tetravalent titanium (Ti) as a conductive material, and a pentavalent or higher valent metal as an N-type impurity. The first upper electrode layer 191 may be formed of, for example, titanium nitride (TiN) doped with an impurity such as niobium (Nb), vanadium (V), tantalum (Ta), or the like. However, a type of material of the first upper electrode layer 191 is not limited thereto, and a metal, a metal nitride, a metal oxide, or the like may be used as a conductive material.

Referring back to FIGS. 2 and 3, the second upper electrode layer 192, covering the first upper electrode layer 191 and filling the empty space H2, may be formed. The second upper electrode layer 192 may be formed of a conductive material, and may be formed using an ALD process. The second upper electrode layer 192 may form the upper electrode 190 together with the first upper electrode layer 191. Accordingly, the capacitor structure CAP, including the lower electrodes 170, the dielectric layer stack 180, and the upper electrode 190, may be formed, thereby manufacturing the semiconductor device 100 illustrated in FIGS. 2 and 3.

While some example embodiments have been shown and described above, it will be apparent to those skilled in the art that modifications and variations could be made without departing from the scope of the appended claims.

What is claimed is:

1. A semiconductor device comprising:
a substrate;
a plurality of lower electrodes on the substrate;
a dielectric layer stack covering the lower electrodes; and
an upper electrode covering the dielectric layer stack,
wherein the dielectric layer stack includes,
a first dielectric layer being on the plurality of lower electrodes, the first dielectric layer including a material having anti-ferroelectricity or paraelectricity, and
a second dielectric layer between the first dielectric layer and the upper electrode, the second dielectric layer including a material having ferroelectricity, and
wherein the upper electrode includes a first upper electrode layer including a base metal and an impurity having a valence greater than the base metal such that the first upper electrode layer forms a depletion region that increases an energy barrier height between the second dielectric layer and the upper electrode.

2. The semiconductor device of claim 1, wherein
the upper electrode further includes a second upper electrode layer, the second upper electrode layer including titanium nitride (TiN), and
the first upper electrode layer includes at least one of niobium (Nb), vanadium (V), and tantalum (Ta), and titanium nitride (TiN).

3. The semiconductor device of claim 2, wherein
the first dielectric layer includes hafnium zirconium oxide ($Hf_xZr_{1-x}O_2$, 0<x<0.5), and
the second dielectric layer includes hafnium oxide ($HfO_2$) or hafnium zirconium oxide ($Hf_xZr_{1-x}O_2$, 0.5≤x<1).

4. The semiconductor device of claim 2, wherein the first upper electrode layer is between the second dielectric layer and the second upper electrode layer and is in contact with the second dielectric layer.

5. The semiconductor device of claim 2, wherein the second upper electrode layer is between the second dielectric layer and the first upper electrode layer.

6. The semiconductor device of claim 1, wherein
the dielectric layer stack further includes a third dielectric layer, and
the third dielectric layer includes a material having ferroelectricity and is between the plurality of lower electrodes and the first dielectric layer of the dielectric layer stack.

7. The semiconductor device of claim 6, wherein
each of the lower electrodes includes a first lower electrode layer including an impurity, and
the first lower electrode layer is in contact with the third dielectric layer of the dielectric layer stack.

8. The semiconductor device of claim 1, wherein
the upper electrode further includes a second upper electrode layer and a third upper electrode layer, and
the first upper electrode layer is between the second upper electrode layer and the third upper electrode layer.

9. The semiconductor device of claim 1, wherein the second dielectric layer of the dielectric layer stack has a thickness of about 5 Å to about 20 Å.

10. The semiconductor device of claim 1, wherein a concentration of the impurity included in the first upper electrode layer is about 2 at % to about 10 at % with respect to a total number of atoms of the dielectric layer stack and the first upper electrode layer.

11. The semiconductor device of claim 1, wherein the second dielectric layer of the dielectric layer stack includes at least one of $HfO_2$, $Hf_xZr_{1-x}O_2$ (0.5≤x<1), $BaTiO_3$, BiFeO, $PbTiO_3$, $PbZr_xTi_{1-x}O_3$ (0<x<1), and $SrTiO_3$.

12. The semiconductor device of claim 1, wherein each of the lower electrodes and the upper electrode includes at least one of platinum (Pt), ruthenium (Ru), gold (Au), iridium (Ir), ruthenium oxide ($RuO_x$), iridium oxide ($IrO_x$), titanium nitride (TiN), niobium nitride (NbN), chromium nitride (CrN), and molybdenum nitride (MoN).

13. A semiconductor device comprising:
a substrate;
a plurality of lower electrodes on the substrate;
a dielectric layer stack covering the plurality of lower electrodes, the dielectric layer stack including a plurality of dielectric layers; and
an upper electrode covering the dielectric layer stack, the upper electrode including a first metal having a first valence,
wherein the dielectric layer stack includes a ferroelectric layer more adjacent to the upper electrode than to the lower electrodes, the ferroelectric layer having a thickness of about 5 Å to about 20 Å, and
the upper electrode includes a first upper electrode layer including the first metal and a second metal having a second valence greater than the first valence such that the first upper electrode layer forms a depletion region that increases an energy barrier height between the ferroelectric layer and the upper electrode.

14. The semiconductor device of claim 13, wherein
the first metal includes titanium (Ti), and
the second metal includes at least one of niobium (Nb), vanadium (V), and tantalum (Ta).

15. The semiconductor device of claim 13, wherein the first upper electrode layer is in contact with the ferroelectric layer.

16. The semiconductor device of claim 13, wherein the dielectric layer stack further includes at least one of an anti-ferroelectric layer and a paraelectric layer between the lower electrodes and the ferroelectric layer.

17. A semiconductor device comprising:
an isolation layer defining active regions on a substrate;
gate electrodes crossing the active regions and extending into the isolation layer;
first impurity regions and second impurity regions in the active regions and a pair of one of the first impurity regions and one of the second impurity regions adjacent to the one of the first impurity regions being on opposite sides of a corresponding one of the gate electrodes;
bit lines over the gate electrodes and connected to the first impurity regions;
conductive patterns on side surfaces of the bit lines and connected to the second impurity regions;

a plurality of lower electrodes vertically extending on the conductive patterns and connected to the conductive patterns, respectively;

at least one supporter layer spaced apart from an upper surface of the substrate in a vertical direction, extending in a direction parallel to the upper surface of the substrate, and being in contact with a side surface of the plurality of lower electrodes adjacent thereto;

a first dielectric layer covering the lower electrodes and the supporter layer, the first dielectric layer including a material having anti-ferroelectricity or paraelectricity;

a second dielectric layer covering the first dielectric layer, the second dielectric layer including a material having ferroelectricity; and an upper electrode covering the second dielectric layer, the upper electrode including a first upper electrode layer including a first metal and a second metal having a valence greater than the first metal such that the first upper electrode layer forms a depletion region that increases an energy barrier height between the second dielectric layer and the upper electrode.

18. The semiconductor device of claim 17, wherein the upper electrode further includes a second upper electrode layer, and the second upper electrode layer includes the first metal.

19. The semiconductor device of claim 18, wherein the first metal includes titanium (Ti), and the second metal includes at least one of niobium (Nb), vanadium (V), and tantalum (Ta).

20. The semiconductor device of claim 17, wherein the upper electrode further includes:

a second upper electrode layer between the second dielectric layer and a first surface of the first upper electrode layer, and a third upper electrode layer on a second surface opposing the first surface of the first upper electrode layer.

* * * * *